(12) United States Patent
Sato et al.

(10) Patent No.: US 7,686,918 B2
(45) Date of Patent: Mar. 30, 2010

(54) MAGNETRON PLASMA PROCESSING APPARATUS

(75) Inventors: Hidenori Sato, Nirasaki (JP); Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 995 days.

(21) Appl. No.: 11/016,997

(22) Filed: Dec. 21, 2004

(65) Prior Publication Data

US 2005/0103440 A1     May 19, 2005

Related U.S. Application Data

(63) Continuation-in-part of application No. PCT/JP03/07802, filed on Jun. 19, 2003.

(30) Foreign Application Priority Data

Jun. 21, 2002   (JP)  .............................. 2002-182009

(51) Int. Cl.
*C23F 1/00*     (2006.01)
*H01L 21/306*   (2006.01)

(52) U.S. Cl. ................................................ 156/345.46
(58) Field of Classification Search ............ 156/345.29, 156/345.43, 345.46
See application file for complete search history.

(56) References Cited

U.S. PATENT DOCUMENTS

| 6,051,100 A | 4/2000 | Walko, II |
| 6,190,495 B1 | 2/2001 | Kubota et al. |

FOREIGN PATENT DOCUMENTS

EP    0 272 142    6/1988

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A magnetron plasma processing apparatus has a baffle plate interposed between a processing space and a gas exhaust port so as to confine a plasma in the processing space in a processing chamber. The baffle plate has through holes allowing the processing space and the gas exhaust port to communicate with each other. The baffle plate is provided along lines of magnetic force of a magnetic field at a position where the plate is located.

11 Claims, 7 Drawing Sheets

MAGNETRON PLASMA PROCESSING APPARATUS

This application is a Continuation-In-Part of PCT International Application No. PCT/JP03/07802 filed on Jun. 19, 2003, which designated the United States.

FIELD OF THE INVENTION

The present invention relates to a magnetron plasma processing apparatus for performing a semiconductor processing such as a magnetron etching or the like on a substrate to be processed, e.g., a semiconductor wafer or the like. The term "semiconductor processing" used herein implies various processes to manufacture semiconductor devices and/or a structure including wiring, electrodes, and the like connected to the semiconductor devices on a substrate to be processed, e.g., a semiconductor wafer or an LCD substrate, by forming thereon a semiconductor layer, an insulating layer, a conductor layer, and the like, in a predetermined pattern.

BACKGROUND OF THE INVENTION

In recent years, there has been utilized a magnetron plasma etching apparatus for performing an etching in a microprocessing by producing a high density plasma at a relatively low pressure atmosphere. In this apparatus, an RF (high frequency) electric field is formed inside a processing space such that electric lines of force vertically penetrate (i.e., an electric field direction is perpendicular to) a semiconductor wafer. In the specification, the term "vertical direction" refers to a direction of gravity. Further, in the processing space, a magnetic field is formed by a permanent magnet such that magnetic force lines are normal to the electric lines of force (i.e., a magnetic field direction is horizontal). By such orthogonal electric and magnetic fields, a magnetron discharge accompanied by drift motions of electrons is performed, so that an etching can be carried out with very high efficiency.

As an example of a magnet for use in the magnetron plasma etching apparatus, there is a dipole ring magnet. The dipole ring magnet has a multiplicity of columnar anisotropic magnet segments disposed in a ring shape around a processing chamber. Magnetization directions of these magnet segments are shifted slightly with respect to each other, such that a uniform horizontal magnetic field is formed on the whole.

As another example of the magnet for use in the magnetron plasma etching apparatus, there is a multi-dipole ring magnet. The multi-dipole ring magnet has a multiplicity of magnet segments disposed in a ring shape to surround a wafer such that N poles and S poles thereof are alternately arranged. The multi-dipole ring magnet forms a multi-pole magnetic field surrounding the circumference of the wafer without forming a magnetic field on an upper surface of the wafer. The above-described dipole magnetic field and multi-pole magnetic field are selectively used depending on a process.

In a plasma processing apparatus including but not limited to the magnetron plasma etching apparatus, it is necessary to prevent a plasma from arriving at a lower part of the processing chamber and thus causing an abnormal discharge. For this, an annular baffle plate is installed at a downward position of the wafer between a mounting table for mounting thereon the wafer and a processing chamber wall to shut off the plasma. In other words, the baffle plate is interposed between the processing space and a gas exhaust port to confine the plasma inside the processing space. The baffle plate has multiple through holes allowing the processing space and the gas exhaust port to communicate with each other.

However, as will be explained below, an abnormal discharge or a plasma leak toward a downside of the baffle plate disposed as mentioned above is observed in a conventional magnetron plasma etching apparatus, according to a study of the present inventors.

SUMMARY OF THE INVENTION

It is, therefore, an object of the present invention to prevent an abnormal discharge or a plasma leak towards a downside of the baffle plate, in a magnetron plasma processing apparatus.

In accordance with a first aspect of the present invention, there is provided a magnetron plasma processing apparatus including: an airtight processing chamber for accommodating therein a substrate to be processed; a gas supply unit for supplying a processing gas into the processing chamber; a gas exhaust unit for exhausting an inside of the processing chamber and setting the inside of the processing chamber in a vacuum state, the gas exhaust unit having a gas exhaust port formed at a lower part of the processing chamber; an upper and a lower electrode facing each other while having therebetween a processing space formed above the gas exhaust port inside the processing chamber, the lower electrode serving as a mounting table for mounting thereon the substrate to be processed; an electric field forming unit for forming an electric field by applying an electric power between the upper and the lower electrode, the electric field exciting the processing gas in the processing space to convert same into a plasma; a magnetic field forming unit for forming a magnetic field whose central magnetic force lines runs parallel to a radial direction of the processing chamber; and a baffle plate interposed between the processing space and the gas exhaust port such that the plasma is confined in the processing space, the baffle plate having multiple through holes allowing the processing space and the gas exhaust port to communicate with each other, and the baffle plate being disposed along magnetic force lines of the magnetic field at a mounting position thereof.

In accordance with a second aspect of the present invention, there is provided a magnetron plasma processing apparatus including: an airtight processing chamber for accommodating therein a substrate to be processed; a gas supply unit for supplying a processing gas into the processing chamber; a gas exhaust unit for exhausting an inside of the processing chamber and setting the inside of the processing chamber in a vacuum state, the gas exhaust unit having a gas exhaust port formed at a lower part of the processing chamber; an upper and a lower electrode facing each other while having therebetween a processing space formed above the gas exhaust port inside the processing chamber, the lower electrode serving as a mounting table for mounting thereon the substrate to be processed; an electric field forming unit for forming an electric field by applying an electric power between the upper and the lower electrode, the electric field exciting the processing gas in the processing space to convert same into a plasma; a magnetic field forming unit for forming a magnetic field whose central magnetic force lines run parallel to a radial direction of the processing chamber; and a baffle plate interposed between the processing space and the gas exhaust port such that the plasma is confined in the processing space, the baffle plate having multiple through holes allowing the processing space and the gas exhaust port to communicate with each other, wherein the through holes are disposed to be tilted with respect to a surface of the baffle plate such that the through holes are substantially normal to magnetic force lines of the magnetic field at a mounting position of the baffle plate.

In accordance with a third aspect of the present invention, there is provided a baffle plate being mounted to a processing chamber and a mounting table of a magnetron plasma processing apparatus, the baffle plate being interposed between a processing space and a gas exhaust port of the apparatus, the baffle plate including: a truncated cone shaped main body tilted along magnetic force lines of a magnetic field at position where the baffle plate is mounted, the main body having multiple through holes allowing the processing space and the gas exhaust port to communicate with each other; an outer mounting portion for mounting the main body to the processing chamber; and an inner mounting portion for mounting the main body to the mounting table.

In accordance with a fourth aspect of the present invention, there is provided a baffle plate being mounted to a processing chamber and a mounting table of a magnetron plasma processing apparatus, the baffle plate being interposed between a processing space and a gas exhaust port of the apparatus, the baffle plate including: a flat circular plate shaped main body having multiple through holes allowing the processing space and the gas exhaust port to communicate with each other, wherein the through holes are disposed to be tilted with respect to a surface of the main body such that the through holes are substantially normal to magnetic force lines of a magnetic field at a mounting position of the baffle plate; an outer mounting portion for mounting the main body to the processing chamber; and an inner mounting portion for mounting the main body to the mounting table.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
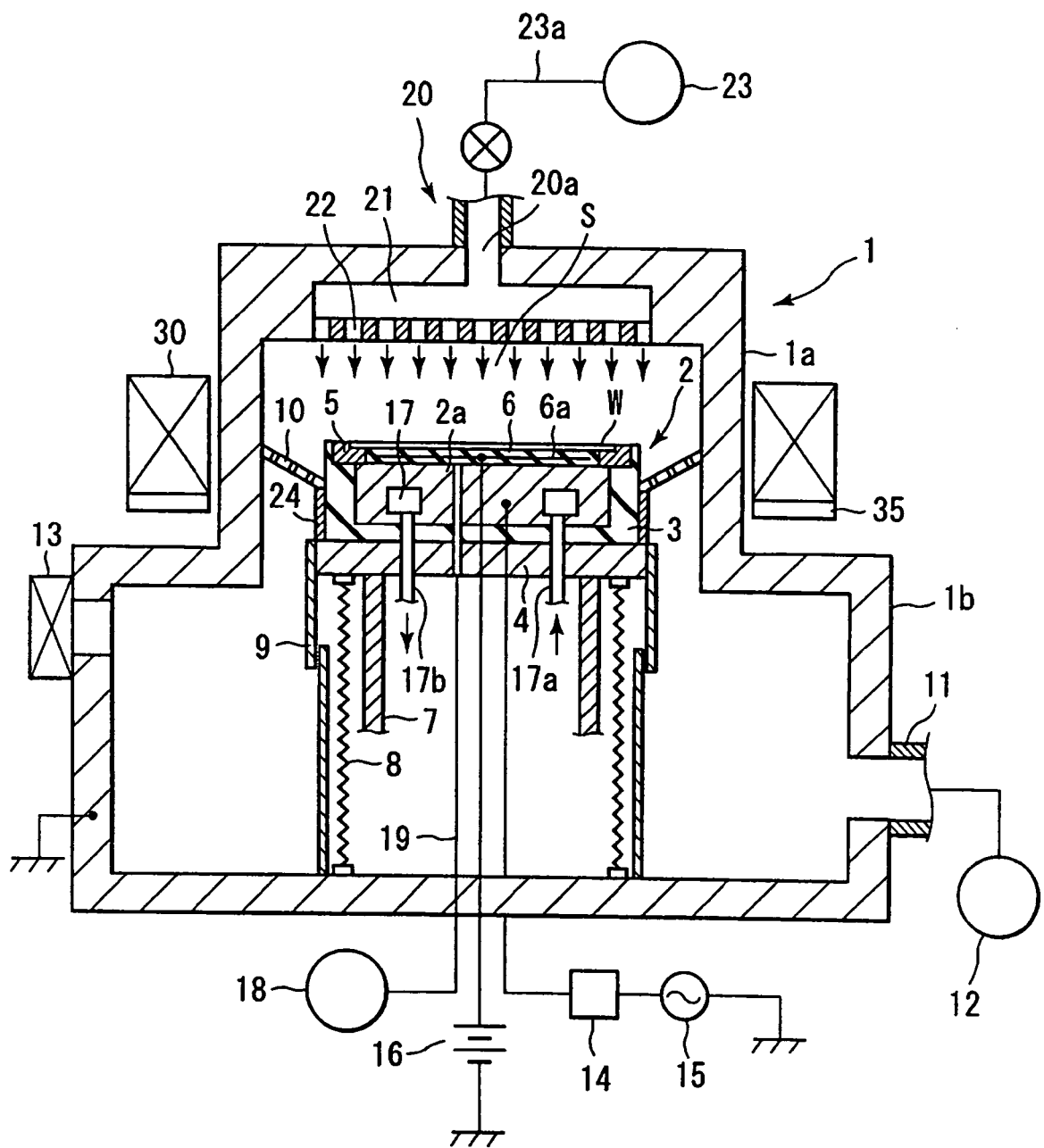
FIG. 1 offers a cross sectional view showing a magnetron RIE plasma etching apparatus having a dipole ring magnet, in accordance with a first embodiment of the present invention.

In the process of developing the present invention, the inventors studied a conventional magnetron plasma etching apparatus wherein a baffle plate is placed between a processing space and a gas exhaust port. As a result, a knowledge as discussed below could be obtained.

In a magnetron plasma processing apparatus such as a magnetron plasma etching apparatus, a baffle plate is generally installed below a mounting position of a wafer. Thus, magnetic force lines of a magnetic field pass through the baffle plate at a slant. Since electrons spirally move along the magnetic force lines, the electrons easily pass the through holes as an angle formed by the through holes of the baffle plate and the magnetic force lines gets small. For the same reason, in the conventional magnetron plasma processing apparatus, it is considered that the baffle plate cannot shut off the plasma sufficiently, which causes the plasma leak towards a downside of the baffle plate or the abnormal discharge.

Hereinafter, preferred embodiments of the present invention, which are configured based on such a knowledge, will be explained with reference to the accompanying drawings. In the following explanation, parts having substantially the same functions and configurations are designated by the same reference numerals, and their redundant explanations will be omitted unless necessary.

FIG. 1 is a cross sectional view showing a magnetron RIE plasma etching apparatus having a dipole ring magnet in accordance with a first embodiment of the present invention. This etching apparatus has an airtight processing chamber (processing vessel) 1. The processing chamber 1 is of a stepped cylindrical shape formed of an upper part 1a of a small diameter and a lower part 1b of a large diameter. The processing chamber 1 is made of, e.g., aluminum whose surface is alumite-treated, and grounded.

Figure 6:
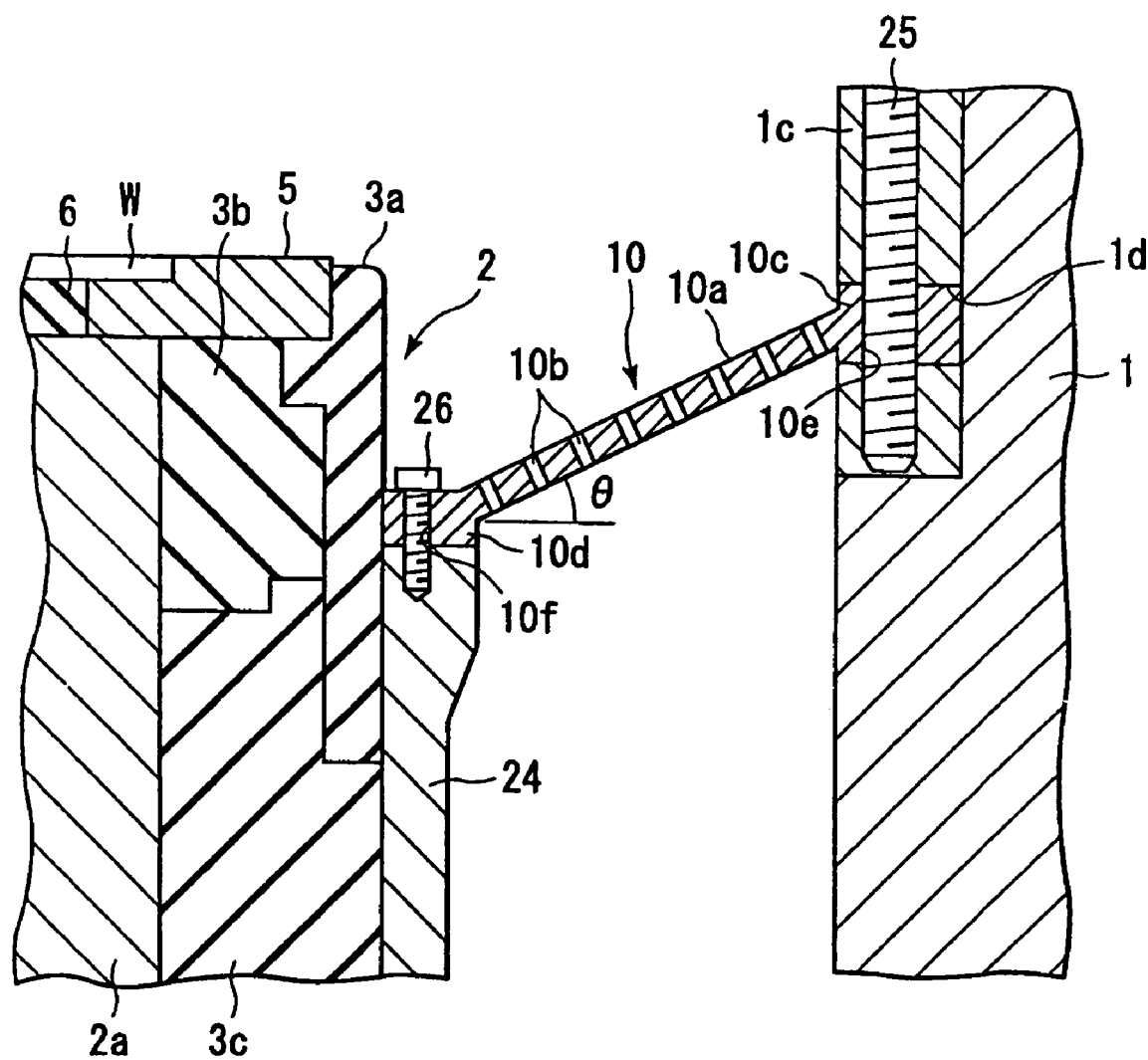
FIG. 6 provides a cross sectional view showing a magnified mounting state of the baffle plate in the apparatus of FIG. 1.

Inside the processing chamber 1, there is installed a mounting table 2 horizontally supporting a wafer W, i.e., a substrate to be processed. The mounting table 2 also serves as a lower electrode. The mounting table 2 has a core member 2a made of, e.g., aluminum; an insulation member 3 covering a sidewall and a bottom part of the core member 2a; and a supporting base 4 made of a conductor for supporting the core member 2a and the insulation member 3. As shown in FIG. 6, the insulation member 3 is divided into three members 3a, 3b and 3c.

On a top surface of the mounting table 2, there is disposed an electrostatic chuck 6 for electrostatically adsorbing and supporting the wafer W. The electrostatic chuck 6 is made of an insulator having therein an electrode 6a. The electrode 6a is connected to a DC power supply 16, which applies thereto a voltage, to thereby adsorb the wafer W by an electrostatic force, e.g., Coulomb force. A focus ring 5 is placed around the electrostatic chuck 6 on the mounting table 2. The top surface of the wafer W adsorbed to the electrostatic chuck 6 coincides with that of the focus ring 5.

A coolant chamber 17 is formed inside the core member 2a of the mounting table 2. In the coolant chamber 17, a coolant is circulated in such a manner that it is introduced via a coolant introduction line 17a and discharged from a coolant discharge line 17b. A cold heat from the coolant is transferred to the wafer W via the mounting table 2, so that a processing surface of the wafer W is controlled at a desired temperature. Further, a heat transfer gas, e.g., He gas, is introduced between a surface of the electrostatic chuck 6 and a rear surface of the wafer W via a gas supply line 19 by a gas introduction mechanism 18. In this way, even though the processing chamber 1 is exhausted by a gas exhaust unit 12 and maintained in a vacuum state, a heat transfer between the electrostatic chuck 6 and the wafer W is maintained. Therefore, the wafer W can be efficiently cooled by the coolant circulated in the coolant chamber 17.

The mounting table 2 can be elevated by a ball screw mechanism containing ball screws 7. A driving part at a lower part of the supporting base 4 is covered with a bellows 8 made of a stainless steel (SUS). A bellows cover 9 is installed outside the bellows 8.

A truncated cone shaped baffle plate 10 is disposed below the wafer W between the mounting table 2 and an inner wall of the processing chamber 1. The baffle plate 10 is fitted to an attachment member 24 of an outer periphery of the mounting table 2 and to the processing chamber 1, and is grounded via the processing chamber 1. The baffle plate 10 will be discussed later in detail.

On a sidewall of the lower part 1b of the processing chamber 1, a gas exhaust port 11 is installed and connected to the gas exhaust unit 12. By operating a vacuum pump of the gas exhaust unit 12, an inside of the processing chamber 1 is exhausted and depressurized to a predetermined vacuum level. Meanwhile, in an upper side of the sidewall of the lower part 1b of the processing chamber 1, there is installed a gate valve 13 opening/closing a loading/unloading part of the semiconductor wafer W.

An RF (high frequency) power supply 15 for producing a plasma is connected to the mounting table 2 via a matching unit 14. An RF power having a predetermined frequency of 13.56 MHz or greater (e.g., 13.56 MHz or 40 MHz) is supplied to the mounting table 2 from the RF power supply 15. Meanwhile, a showerhead 20 is disposed in parallel with the mounting table 2, i.e., facing the mounting table 2. The showerhead 20 serves as an upper electrode and is grounded. Therefore, the mounting table 2 serving as the lower electrode and the showerhead 20 serving as the upper electrode comprises a pair of parallel plate electrodes The showerhead 20 is formed as a ceiling wall part of the processing chamber 1. A head space 21 is formed inside the showerhead 20. At a lower surface of the showerhead 20, there are formed a plurality of gas discharge holes 22 communicating with the head space 21. A gas inlet 20a communicating with the head space 21 is formed in a upper part of the showerhead 20. A processing gas supply unit 23 for supplying a predetermined processing gas is connected to the gas inlet 20a via the gas supply line 23a.

The processing gas is supplied from the processing gas supply unit 23 into the head space 21 of the showerhead 20 via the gas supply line 23a and the gas inlet 20a. Then, the processing gas is uniformly discharged in the processing chamber 1 through the gas discharge holes 22. As the processing gas supplied from the processing gas supply unit 23, a halogen based gas, an Ar gas, an $O_2$ gas or the like, which is commonly used in this field, may be utilized.

Around the upper part 1a of the processing chamber 1, a dipole ring magnet 30 is horizontally placed such that central magnetic force lines of a magnetic field are disposed above the baffle plate 10, e.g., the central magnetic force lines coincide with the top surface of the wafer W on the mounting table 2. The dipole ring magnet 30 is rotated in a horizontal plane by a rotation mechanism 35.

Figure 2:
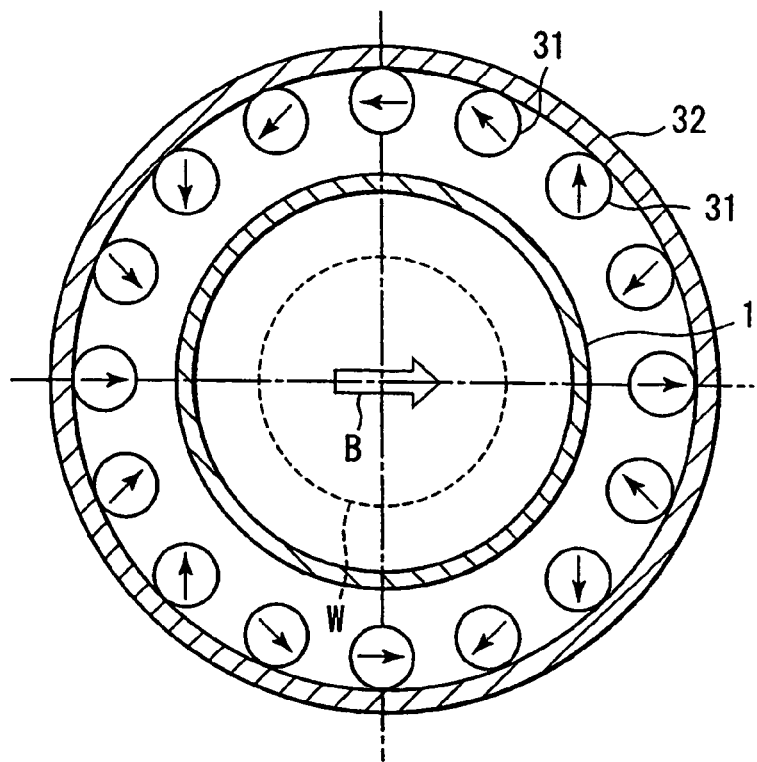
FIG. 2 illustrates a horizontal cross sectional view schematically showing the dipole ring magnet in the apparatus of FIG. 1.
Figure 3:
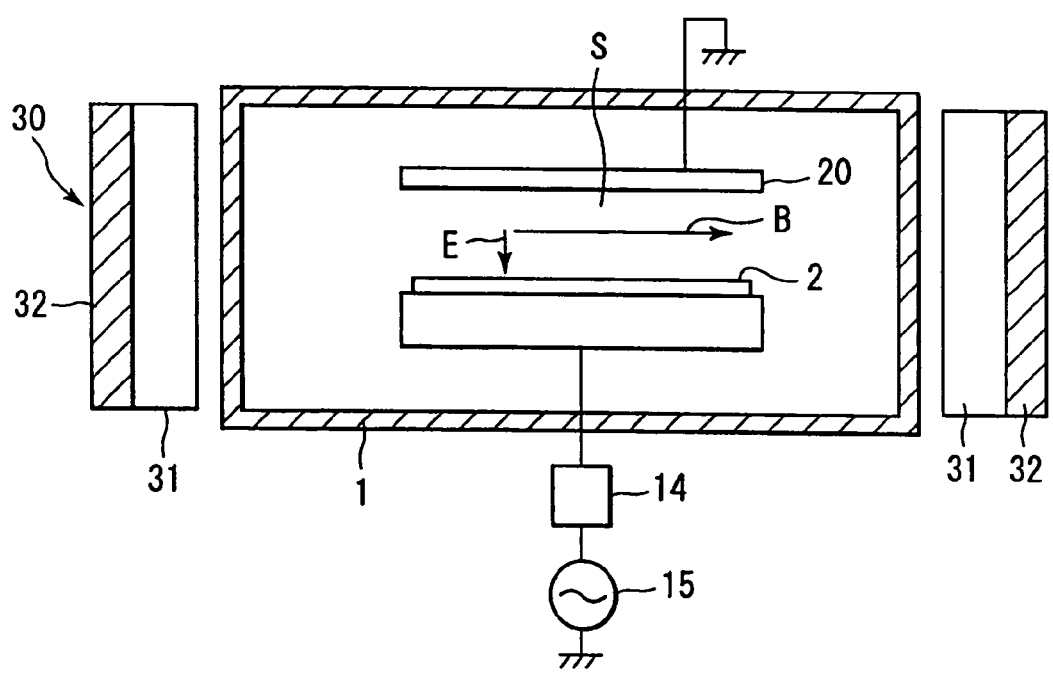
FIG. 3 is a schematic view for explaining an electric field and a magnetic field formed inside a processing chamber of the apparatus described in FIG. 1.

FIG. 2 is a horizontal cross sectional view schematically showing the dipole ring magnet 30. As shown in FIG. 2, the dipole ring magnet 30 is configured such that a multiplicity of columnar anisotropic magnet segments 31 are attached to a ring shaped casing 32 of a magnetic material. In this example, sixteen columnar anisotropic magnet segments 31 forming a columnar shape are arranged in a ring shape. In FIG. 2, arrows shown in the magnet segments 31 indicate magnetization directions. As shown in FIG. 2, the magnetization directions of the magnet segments 31 are shifted slightly with respect to each other, such that a uniform horizontal magnetic field B heading for one direction on the whole is formed above the wafer W FIG. 3 is a schematic view for explaining an electric field and a magnetic field formed inside the processing chamber 1. As shown in FIG. 3, in a processing space S between the mounting table 2 and the showerhead 20, an RF electric field E of a vertical direction is formed by an RF power applied from the RF power supply 15 to the mounting table 2. Further, in the processing space S, a horizontal magnetic field B is formed above the wafer W by the dipole ring magnet 30. By the orthogonal electric and magnetic fields as formed above, the magnetron discharge is carried out, whereby a plasma of an etching gas of a high energy state is produced and a predetermined film on the wafer W is etched.

Figure 4:
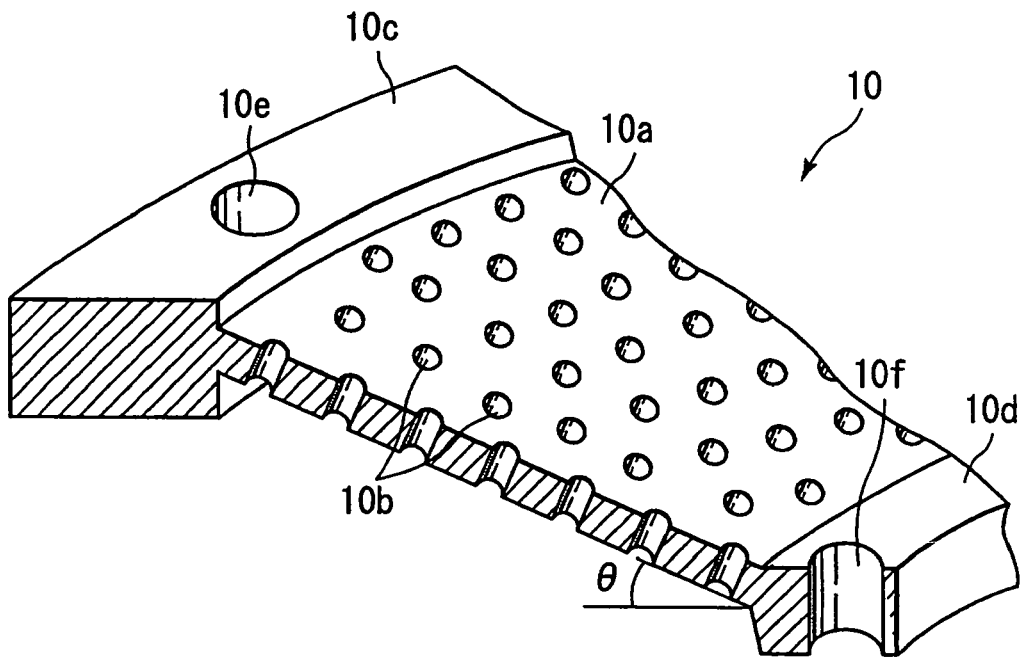
FIG. 4 sets forth to a perspective view showing a cutoff portion of a baffle plate in the apparatus of FIG. 1.
Figure 5:
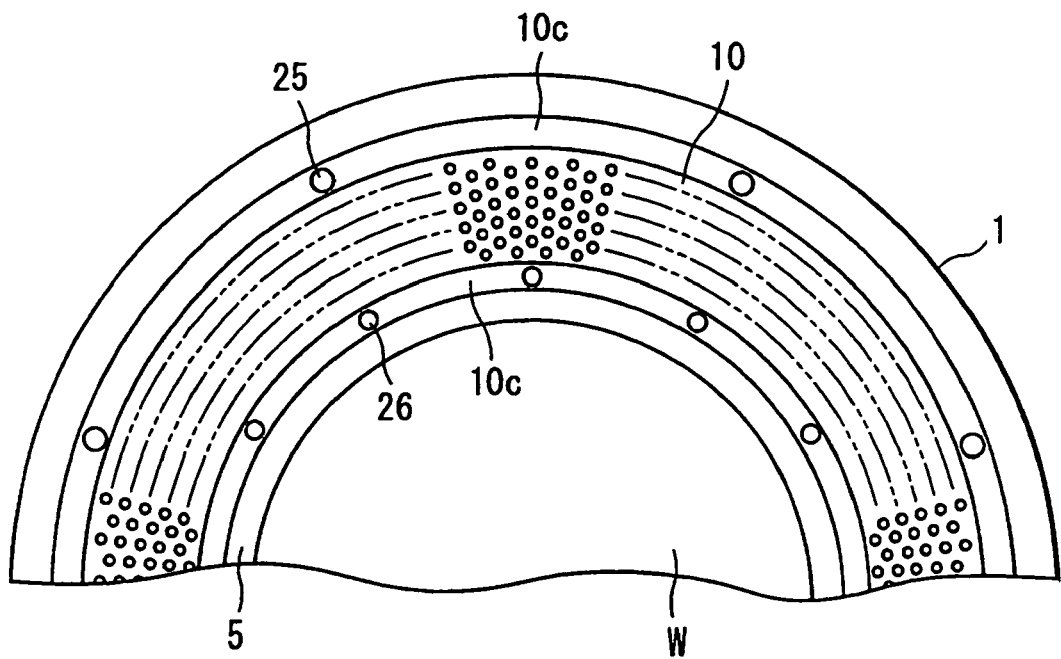
FIG. 5 presents a plain view showing a part of the baffle plate in the apparatus of FIG. 1.

In the following, the baffle plate 10 will be explained in detail. FIG. 4 is a perspective view showing a cutoff portion of the baffle plate 10. FIG. 5 is a plain view showing a part of the baffle plate 10. FIG. 6 is a cross sectional view showing a magnified mounting state of the baffle plate 10.

The baffle plate 10 is formed by thermally spraying ceramics, e.g., alumina, on a metal, e.g., aluminum, to increase plasma resistance. The baffle plate 10 has in a center thereof a circular hole into which the mounting table is inserted, and has a truncated cone shaped main body 10a having thereon multiple circular gas passing holes (through holes) 10b. An outer mounting portion 10c is formed at an outer peripheral portion of the main body 10a, which is fitted into a cutout portion 1d (see FIG. 6) of an attachment fixture 1c of the processing chamber 1. An inner mounting portion 10d is formed at an inner peripheral portion of the main body 10a, and mounted on an attachment member 24 around the mounting table 2.

The outer mounting portion 10c has bolt insertion holes 10e. The outer mounting portion 10c and the attachment fixture 1c of the processing chamber are engaged by multiple bolts 25 inserted from the upper part of the processing chamber 1. Meanwhile, the inner mounting portion 10d has bolt insertion holes 10f. The inner mounting portion 10d and the attachment member 24 are engaged by bolts 26.

Since the main body 10a has a truncated cone shape as mentioned above, the baffle plate 10 is tilted upward with an angle θ from a central side towards an end side, in its vertical cross sectional view. In this case, the angle θ is set to be substantially equal to a tilt angle of the magnetic field (a tilt angle of the magnetic force lines passing the baffle plate 10) when viewed with respect to the mounted baffle plate 10, as shown in FIG. 7. For example, the angle θ is set as 10~45 degrees.

A diameter and an aspect ratio of the gas passing hole 10b are determined such that the plasma is not likely to penetrate therethrough and the exhaust conductance can be secured sufficiently. For example, the diameter is set as 1.7 mm and a height (i.e., a thickness of the baffle plate 10) is set as 3 mm. A shape of the gas passing hole 10b is not limited to a circle, but may be of an elliptic or a slit shape.

In other words, the baffle plate 10 is interposed between the processing space S and the gas exhaust port 11 such that the plasma is confined inside the processing space S. The baffle plate 10 is mounted to be disposed along the magnetic force lines of the magnetic field. The baffle plate 10 has multiple gas passing holes (through holes) 10b allowing the processing space S and the gas exhaust port 11 to communicate with each other. As shown in FIG. 6, the gas passing holes 10b are formed substantially normal to the front and rear surfaces of the baffle plate 10. Thus, the gas passing holes 10b are placed substantially normal to the magnetic force lines of the magnetic field at the mounting position of the baffle plate 10.

Next, an operation of the magnetron RIE plasma etching apparatus as configured above will be discussed.

First, the wafer W is loaded into the processing chamber 1 by opening the gate valve 13 and mounted on the mounting table 2. Subsequently, a predetermined voltage is applied to the electrode 6a of the electrostatic chuck 6 from the DC power supply 16, so that the wafer W is kept adsorbed onto the electrostatic chuck 6 by coulomb force. Then, the mounting table 2 is elevated to a position indicated in FIG. 1. The inside of the processing chamber 1 is then exhausted through the gas exhaust port 11 by a vacuum pump of the gas exhaust unit 12.

Thereafter, a predetermined processing gas for etching is introduced into the processing chamber 1 from the gas supply unit 23 while exhausting the inside of the processing chamber 1, so that an inner pressure of the processing chamber is maintained at, e.g., about 1.33~13.3 Pa. Further, a predetermined RF power of 13.56 MHz or greater is supplied into the mounting table 2 from the RF power supply 15. In this way, an RF electric field is formed between the showerhead 20 as the upper electrode and the mounting table 2 as the lower electrode.

At this time, a horizontal magnetic field B is formed above the wafer W by the dipole ring magnet 30. Hence, orthogonal electric and magnetic fields are formed in the processing space S where the wafer W exists, between the electrodes, and a magnetron discharge is caused by the resultant electron drift. Further, a predetermined film on the wafer is etched by the plasma of the etching gas produced by the magnetron discharge.

Figure 7A:
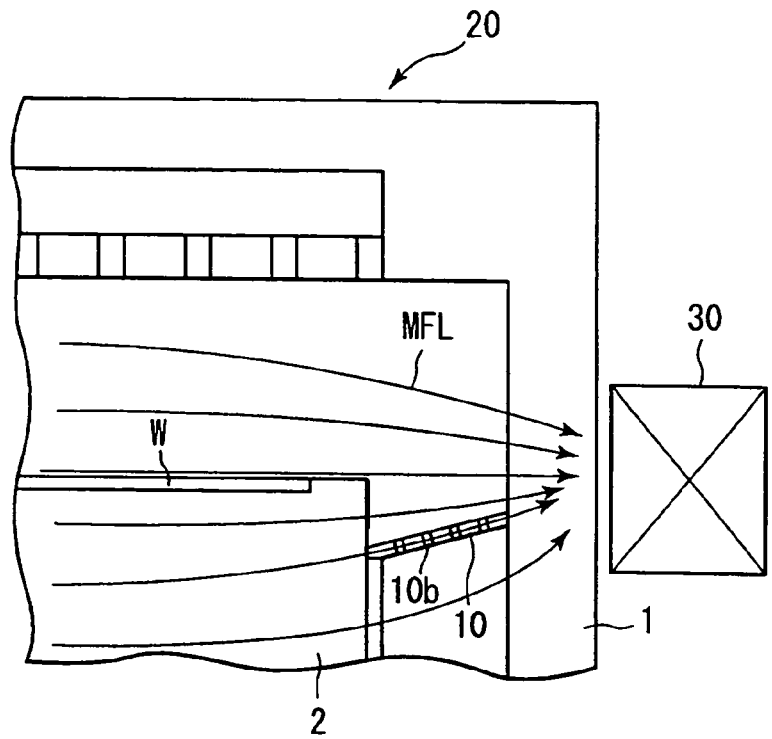
FIG. 7A describes a schematic view showing a relationship between the baffle plate in accordance with the first embodiment and magnetic force lines.
Figure 7B:
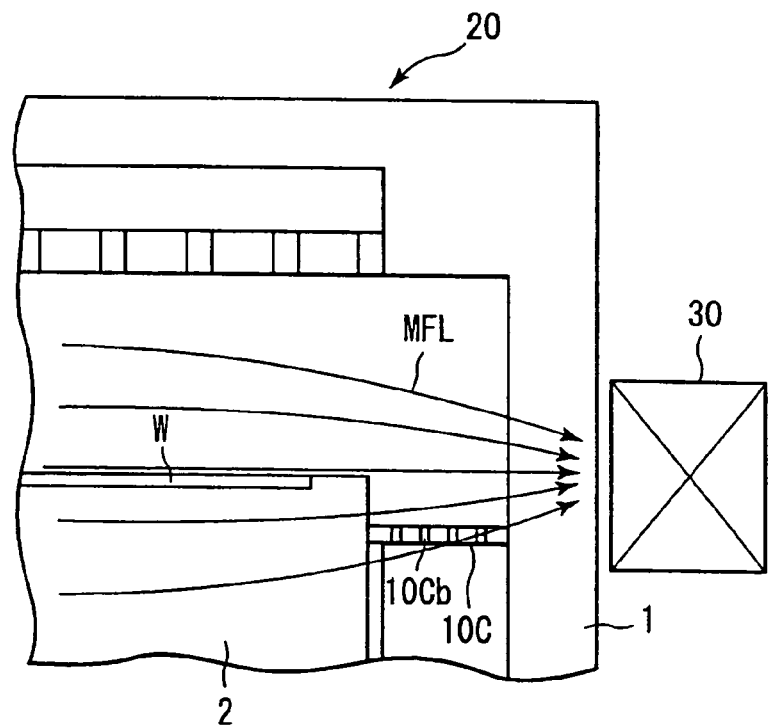
FIG. 7B depicts a schematic view showing a relationship between a conventional baffle plate and magnetic force lines.

FIG. 7A is a schematic view showing a relationship between the baffle plate in accordance with the first embodiment and magnetic force lines. FIG. 7B is a schematic view showing a relationship between the conventional baffle plate and magnetic force lines. As shown in FIGS. 7A and 7B, in the horizontal magnetic field heading for one direction, which is formed by the dipole ring magnet 30, the direction of the magnetic force lines on the top surface of the wafer W becomes horizontal, in the vertical cross sectional view. However, as the horizontal magnetic field goes apart from the wafer W along the vertical direction, vertical components thereof increase.

In such a situation, a relationship between the baffle plate 10C and magnetic force lines MFL is as shown in FIG. 7B, in case of the baffle plate 10C horizontally disposed in a same way as in the conventional art. Namely, the baffle plate 10 is of a flat circular plate shape and horizontally placed regardless of the direction of the magnetic force lines MFL. Through holes 10Cb of the baffle plate are formed to be substantially normal to the front and rear surfaces of the baffle plate 10C.

Therefore, in a state described in FIG. 7B, the magnetic force lines MFL pass through the baffle plate 10C at a slant. Further, relatively plenty of vertical components of the magnetic field exist when viewed with respect to the mounting position of the baffle plate 10C. Electrons easily pass the through holes 10Cb as the angle formed by the through hole 10Cb of the baffle plate and the magnetic force line MFL gets small, since the electrons spirally move along the magnetic force lines MFL. Thus, since the baffle plate 10C cannot shut off the plasma sufficiently in the conventional magnetron plasma processing apparatus, the plasma leak towards a downside of the baffle plate 10C or the abnormal discharge is generated.

Contrary to this, in case of the baffle plate 10 in accordance with the first embodiment, a relationship between the baffle plate 10 and the magnetic force lines MFL is as shown in FIG. 7A. That is, the baffle plate 10 is of a truncated cone shape, and is tilted upward in an outward the radial direction along the magnetic force lines MFL. The through holes 10b of the baffle plate are formed to be substantially normal to the front and rear surfaces of the baffle plate 10.

Accordingly, in a state shown in FIG. 7A, the magnetic force lines MFL pass the baffle plate 10 in parallel with each other. Further, there is few or no vertical components of the magnetic field at the mounting position of the baffle plate 10. Thus, the electrons spirally moving along the magnetic force lines MFL hardly pass the through holes 10b formed in the baffle plate, so that an effect of blocking the plasma can be enhanced. Therefore, the plasma leak or the abnormal discharge can be prevented.

Further, the baffle plate 10 is of a truncated cone shape and tilted upward in an outward radial direction along the magnetic force lines MFL, so that an area of the baffle plate 10 becomes larger. Therefore, more gas passing holes (through holes) 10b can be formed in the baffle plate 10, compared with the conventional flat circular plate shaped baffle plate 10C. By employing such a configuration, exhaust conductance between the processing space S and the gas exhaust port 11 can be improved.

It is preferable that the tilt angle θ of the baffle plate 10 is substantially equal to a tilt angle in the vertical direction of the magnetic force lines passing therethrough, i.e., a tilt angle in the vertical direction of the magnetic field at the mounting position of the baffle plate 10. Due to this, vertical components of the magnetic field with respect to the baffle plate 10 are substantially removed and thus the effect of blocking the plasma can be further increased.

Figure 8A:
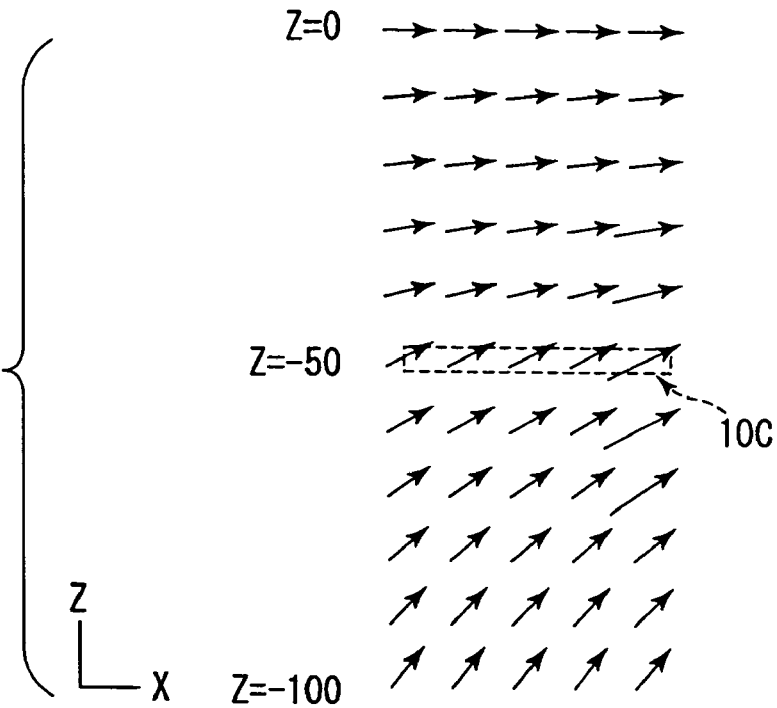
FIG. 8A shows a relationship between a simulation result of a magnetic field direction and a conventional baffle plate.
Figure 8B:
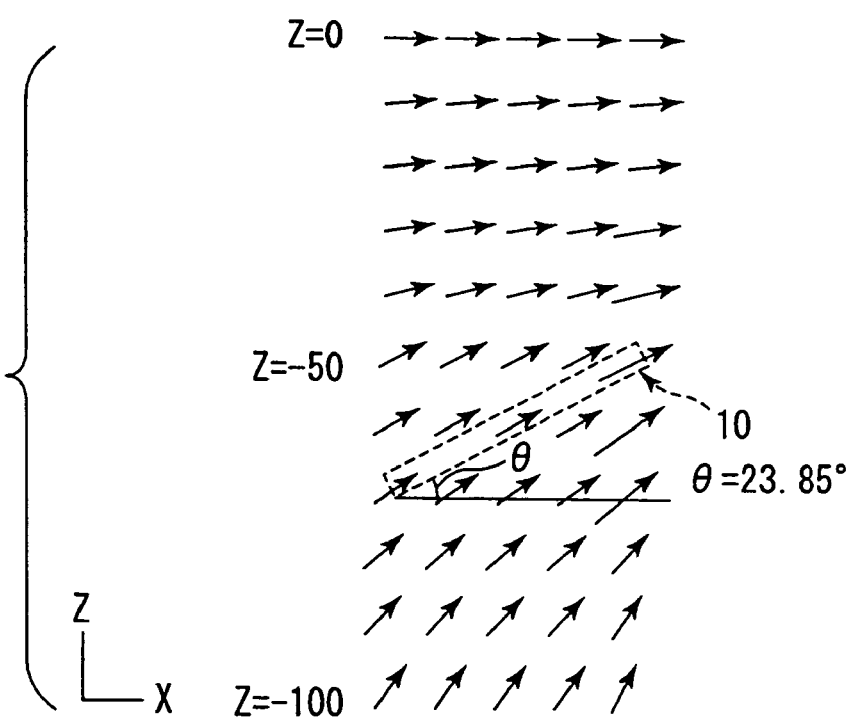
FIG. 8B describes a relationship between a simulation result of a magnetic field direction and a baffle plate in accordance with the first embodiment.

In the ensuing discussion, a result of an optimum arrangement of the baffle plate, which was obtained by the simulation of the magnetic field direction, will be discussed. Here, a magnetic flux density in a center of the wafer was set to 0.012 T (120 Gauss), in the apparatus for a 300 mm wafer. FIG. 8A shows a relationship between a simulation result of a magnetic field direction and the conventional baffle plate 10C. FIG. 8B describes a relationship between a simulation result of a magnetic field direction and the baffle plate 10 in accordance with the first embodiment.

FIG. 8A describes a case where the baffle plate 10C is horizontally placed such that a vertical position of the top surface of the wafer is given as Z=0, and a center of a thickness thereof becomes Z=−50 (mm). In this case, since the vertical components of the magnetic field are relatively large at the mounting position of the baffle plate 10C, it can be noted that the effect of blocking the plasma is small. In contrast, if the central side part of the baffle plate 10 is tilted downward and θ is set to 3.85°, the tilt angle thereof becomes substantially equal to that of the magnetic field.

Based on these results, a truncated cone shaped baffle plate having such a tilt angle was manufactured actually. Further, a magnetron plasma test was conducted by mounting the manufactured baffle plate in the apparatus. As a result, it is confirmed that the plasma leak and the abnormal discharge are hardly generated at a lower part of the baffle plate.

Figure 9:
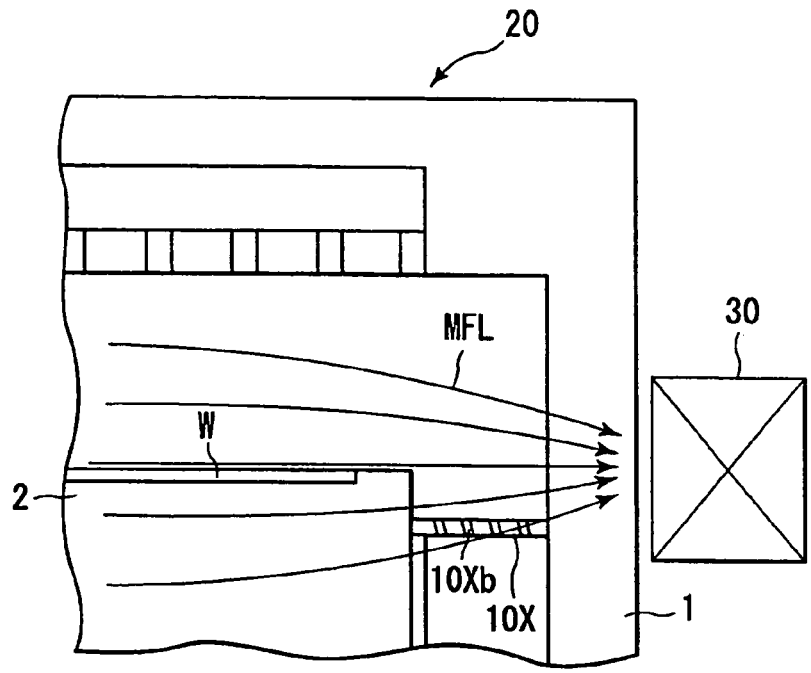
FIG. 9 is a schematic view showing a relationship between a baffle plate and magnetic force lines in a magnetron RIE plasma etching apparatus in accordance with a second embodiment of the present invention.

FIG. 9 is a schematic view showing a relationship between a baffle plate and magnetic force lines, in a magnetron RIE plasma etching apparatus in accordance with a second embodiment of the present invention. In the apparatus of this embodiment, parts other than a baffle plate are substantially equal to those of the apparatus the previously described embodiment shown in FIG. 1 of.

In the second embodiment, like the previous embodiment, a baffle plate 10X is interposed between the processing space S and the gas exhaust port 11 (see FIG. 1) such that the plasma is confined in the processing space S. In the baffle plate 10X, multiple gas passing holes (through holes) 10Xb are formed to allow the processing space S and the gas exhaust port 11 to communicate with each other. Further, the baffle plate 10X has the substantially same shape as that of FIG. 1 (by employing the outer mounting portion 10c and the inner mounting portion 10d), which is fitted to the processing chamber 1 and the mounting table 2. Still further, the baffle plate 10X is formed by thermally spraying ceramics, e.g., alumina, on a metal, e.g., aluminum, in order to increase plasma resistance.

The baffle plate 10X is of a flat circular plate shape and horizontally placed regardless of the direction of the magnetic force lines of the magnetic field at the mounting position thereof. However, the gas passing holes (through holes) 10Xb are configured to be tilted with respect to the front and rear surfaces of the baffle plate 10X such that they are substantially normal to the magnetic force lines of the magnetic field at the mounting position of the baffle plate 10X. Thus, the electrons spirally moving along the magnetic force lines hardly pass the through holes 10Xb formed in the baffle plate, so that the effect of blocking the plasma can be enhanced. Therefore, the plasma leak or the abnormal discharge can be prevented. Here, the through holes 10Xb are formed to have an angle, e.g., 45~80 degree, with respect to the front and rear surfaces of the baffle plate 10X.

Further, in accordance with the second embodiment, the baffle plate 10X is not necessarily horizontal, and it is a primary feature thereof that the gas passing holes (through holes) 10Xb are formed to be tilted such that they are substantially normal to the magnetic force lines of the magnetic field at the mounting position of the baffle plate 10X. A shape of each gas passing hole 10Xb is not limited to a circle, but may be of an elliptic or a slit shape.

Figure 10:
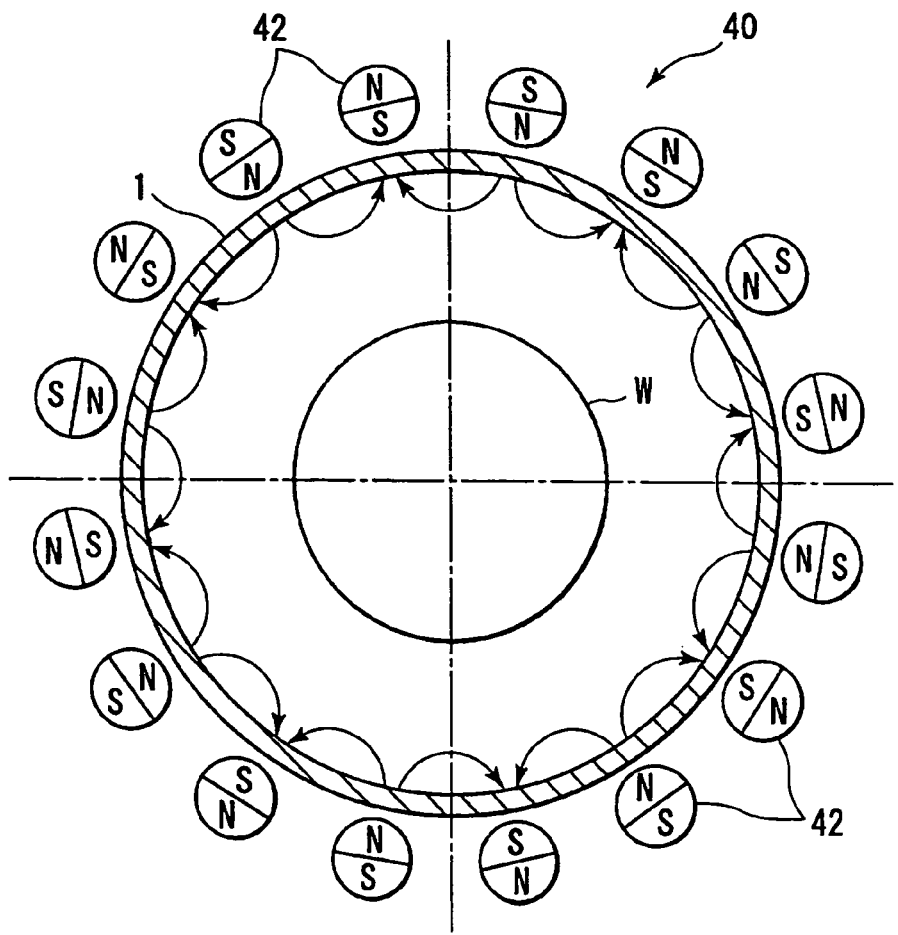
FIG. 10 illustrates a horizontal cross sectional view schematically showing a multi-dipole ring magnet.

The present invention is not limited to the aforementioned embodiments but various changes thereof may be made. For example, a multi-pole ring magnet forming a magnetic field around the wafer, i.e., in the vicinity of an inner wall of the processing chamber, may be used as a magnetic field generation means, instead of the dipole ring magnet. FIG. 10 is a horizontal cross sectional view schematically showing a multi-pole ring magnet 40. The multi-pole ring magnet 40 has a multiplicity of magnet segments 42 placed in a ring shape around the processing chamber 1 such that N poles and S poles are alternately arranged (such that the pole directions are alternately reversed). The multi-pole ring magnet 40 forms a multi-pole magnetic field, and magnetic flux densities thereof are, e.g., about 0.02~0.2 T (200~2000 Gauss) in the inner wall surface of the processing chamber 1 and about 0.0005 T (5 Gauss) in the central part of the wafer W. In this case, the baffle plate may be disposed along the magnetic force line of the multi-pole magnetic field formed around the wafer, according to the shape shown in FIG. 7A. Alternatively, according to the shape shown in FIG. 9, the gas passing holes of the baffle plate may be formed such that they are tilted to be normal to the magnetic force lines of multi-pole magnetic field.

Further, in the above-described embodiments, it is configured such that the processing chamber is of a columnar shape; the mounting table is of a columnar shape; and the baffle plate is of a truncated cone shape or a flat circular plate shape. However, the baffle plate may adopt various shapes depending on the shapes of the processing chamber and the mounting table.

Still further, in the aforementioned embodiments, examples of applying the present invention to the magnetron plasma etching apparatus have been described. However, the present invention may be applied to other plasma processes. For instance, the present invention may be applied to a magnetron plasma CVD apparatus by changing the processing gas from the etching gas to any well-known CVD gas. Further, by placing a target inside the processing chamber to face the substrate to be processed, it may be applied to a magnetron plasma sputtering apparatus. Meanwhile, as the substrate to be processed, any substrate other than the semiconductor wafer, e.g., a substrate for a liquid crystal display (LCD) or the like, may be used.

While the invention has been shown and described with respect to the preferred embodiments, it will be understood by those skilled in the art that various changes and modifications may be made without departing from the spirit and scope of the invention as defined in the following claims.

What is claimed is:

1. A magnetron plasma processing apparatus comprising:
   an airtight processing chamber for accommodating therein a substrate to be processed;
   a gas supply unit for supplying a processing gas into the processing chamber;
   a gas exhaust unit for exhausting an inside of the processing chamber and setting the inside of the processing chamber in a vacuum state, the gas exhaust unit having a gas exhaust port formed at a lower part of the processing chamber;
   an upper and a lower electrode facing each other while having therebetween a processing space formed above the gas exhaust port inside the processing chamber, the lower electrode serving as a mounting table for mounting thereon the substrate to be processed;
   an electric field forming unit for forming an electric field by applying an electric power between the upper and the lower electrode, the electric field exciting the processing gas in the processing space to convert same into a plasma;
   a baffle plate interposed between the processing space and the gas exhaust port such that the plasma is confined in the processing space, wherein the baffle plate includes a main body having multiple through holes allowing the processing space and the gas exhaust port to communicate with each other and a mounting portion for mounting the main body in the processing chamber; and
   a magnetic field forming unit for forming a magnetic field, wherein the magnetic field includes central magnetic force lines running parallel to a top surface of the substrate mounted on the mounting table and magnetic force lines, which pass through the main body of the baffle plate and are tilted with respect to the central magnetic force lines, and
   wherein the main body of the baffle plate is disposed substantially parallel to the magnetic force lines passing therethrough.

2. The magnetron plasma processing apparatus of claim 1, wherein the main body of the baffle plate is placed below the central magnetic force lines of the magnetic field and is tilted upward in an outward radial direction along the magnetic force lines passing therethrough; and the through holes are formed substantially normal to a surface of the main body at which openings of the through holes are formed.

3. The magnetron plasma processing apparatus of claim 1, wherein the main body of the baffle plate has a truncated cone shape and the through holes are formed substantially normal to a surface of the main body at which openings of the through holes are formed.

4. The magnetron plasma processing apparatus of claim 1, wherein the through holes are of a circular, an elliptic or a slit shape.

5. The magnetron plasma processing apparatus of claim 1, wherein the magnetic field forming unit has a dipole ring magnet formed by arranging a multiplicity of anisotropic magnet segments in a ring shape around the processing chamber.

6. The magnetron plasma processing apparatus of claim 1, wherein the magnetic field forming unit has a multi-pole ring magnet formed by arranging a multiplicity of magnet segments in a ring shape around the processing chamber, the multiplicity of magnet segments being arranged such that pole directions are alternately reversed.

7. The magnetron plasma processing apparatus of claim 1, wherein a tilt angle between the central magnetic force lines and the magnetic force lines passing through the main body of the baffle plate is about 10 to 45 degrees.

8. A baffle plate for use in a processing chamber of a magnetron plasma processing apparatus, the baffle plate being interposed between a processing space and a gas exhaust port of the apparatus, the baffle plate comprising:

a truncated cone shaped main body tilted substantially parallel to magnetic force lines of a magnetic field passing therethrough, the main body having multiple through holes allowing the processing space and the gas exhaust port to communicate with each other, the through holes being formed substantially normal to a surface of the main body at which openings of the through holes are formed;

an outer mounting portion for mounting the main body to the processing chamber; and an inner mounting portion for mounting the main body to the mounting table.

9. The baffle plate of claim 8, wherein a tilt angle of the main body is set as 10 to 45 degrees.

10. The baffle plate of claim 8, wherein the through holes are of a circular, an elliptic or a slit shape.

11. The baffle plate of claim 8, wherein the magnetic field includes central magnetic force lines running parallel to a top surface of a substrate mounted on the mounting table and the magnetic force lines passing through the main body of the baffle plate and wherein the magnetic force lines passing through the main body of the baffle plate are tilted with respect to the central magnetic force lines.

* * * * *